United States Patent [19]
Watts et al.

[11] Patent Number: 5,985,748
[45] Date of Patent: Nov. 16, 1999

[54] METHOD OF MAKING A SEMICONDUCTOR DEVICE USING CHEMICAL-MECHANICAL POLISHING HAVING A COMBINATION-STEP PROCESS

[75] Inventors: David K. Watts; Franklin D. Nkansah; John Mendonca, all of Austin, Tex.

[73] Assignee: Motorola, Inc., Schaumburg, Ill.

[21] Appl. No.: 08/980,782

[22] Filed: Dec. 1, 1997

[51] Int. Cl.[6] .................................................. H01L 21/4763
[52] U.S. Cl. .......................... 438/622; 438/631; 438/633; 438/691; 438/693; 438/734; 438/645
[58] Field of Search ..................................... 438/622, 645, 438/626, 631, 633, 691, 693, 734

[56] References Cited

U.S. PATENT DOCUMENTS

| | | | |
|---|---|---|---|
| 4,959,113 | 9/1990 | Roberts | 156/636 |
| 5,225,034 | 7/1993 | Yu et al. | 156/636 |
| 5,391,258 | 2/1995 | Brancaleoni et al. | 156/636 |
| 5,527,423 | 6/1996 | Neville et al. | 156/636.1 |
| 5,676,587 | 10/1997 | Landers | 451/57 |
| 5,700,383 | 12/1997 | Feller et al. | 438/645 |

*Primary Examiner*—John F. Niebling
*Assistant Examiner*—Lynne A. Gurley
*Attorney, Agent, or Firm*—James L. Clingan, Jr.

[57] ABSTRACT

A method of chemical-mechanical polishing of a semiconductor device utilizes a combination of polishing steps, including a first step using a first slurry containing an abrasive component (i.e., mechanical component) and a chemical component (i.e., chemical reactants), and a second polishing step using a second slurry having a reduced amount of the abrasive component. The method is carried out with respect to metal (39), such as copper, deposited on a dielectric layer (34) and the first polishing step is stopped before the entirety of the metal overlying the dielectric layer is removed. In one embodiment, the second slurry has no abrasive component.

21 Claims, 4 Drawing Sheets

METHOD OF MAKING A SEMICONDUCTOR DEVICE USING CHEMICAL-MECHANICAL POLISHING HAVING A COMBINATION-STEP PROCESS

FIELD OF THE INVENTION

The present invention relates generally to chemical-mechanical polishing (CMP) of semiconductor devices and, more particularly, to a method of CMP that utilizes a combination of CMP steps.

BACKGROUND OF THE INVENTION

CMP is a well known process in the semiconductor industry used to remove and planarize layers of material deposited on a semiconductor device to achieve a planar topography on the surface of the semiconductor device. To remove and planarize the layers of the deposited material, including dielectric and metal materials, CMP typically involves wetting a pad with a chemical slurry containing abrasive components and mechanically "buffing" the front surface of the semiconductor device against the wetted pad to remove the layers of deposited materials on the front surface of the semiconductor device and planarize the surface.

CMP has been subject to ever increasing intensive investigation and engineering with the continued focus on high speed semiconductor devices, such as those utilizing high-conductivity copper lines (interconnects). As aluminum lines and tungsten plugs are replaced with copper lines and plugs to enhance the speed of semiconductor devices by decreasing line resistance, CMP parameters utilized in connection with tungsten plugs or dielectrics may not be applicable to copper.

In addition to use of copper for metal lines in today's semiconductor devices, the line density has also been increasing. That is, today's semiconductor devices have a very high density of metal lines per unit area in a semiconductor die. Accordingly, modern semiconductor devices have relatively small line widths, and accordingly, relatively small widths associated with the dielectric material separating the lines from each other. Such fine spacing between metal lines and between areas of dielectric material presents numerous difficulties with respect to CMP of the metal, such as copper, that is deposited to form the lines. For example, very fine control of the CMP process must be executed in order to prevent undesirable erosion of the dielectric material between the metal lines, as well as undesirable dishing or dishing of the metal. Both erosion and dishing contribute to increased line resistance, and accordingly, lower speed.

Accordingly, a need exists in the art for appropriate slurry compositions for CMP of copper, as well as a process for very finely and accurately controlling CMP in critical areas such as those areas having a high density of metal lines.

BRIEF DESCRIPTION OF THE DRAWINGS

A better understanding of the present invention can be obtained when the following detailed description is considered in conjunction with the following drawings, in which.

Skilled artisans shall appreciate that elements in the figures are illustrated for simplicity and clarity and have not necessarily been drawn to scale. For example, the dimensions of some of the elements in the figures are exaggerated relative to other elements to help to improve understanding of embodiment(s) of the present invention.

DETAILED DESCRIPTION OF THE DRAWINGS

Figure 1:
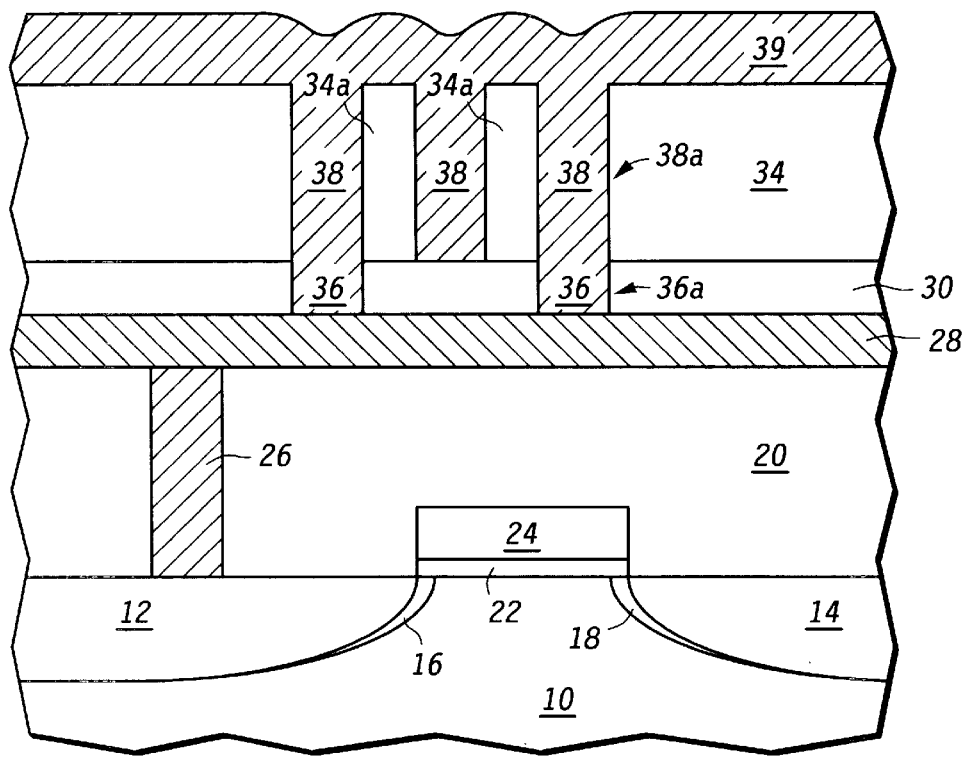
FIG. 1 is a cross-sectional view of a semiconductor device after deposition of a metal which forms lines.

FIG. 1 illustrates a semiconductor device prior to CMP (chemical-mechanical polishing). As shown, substrate 10 has a source region 12 and a drain region 14, and also includes lightly doped drains 16 and 18. Substrate 10 may be made of any conventional semiconductor materials, including monocrystalline silicon, silicon on insulator (SOI), germanium, doped monocrystalline silicon, and epitaxially grown silicon on a monocrystalline silicon substrate. Source and drain regions 12 and 14 are formed according to conventional processes, after formation of gate oxide layer 22 and gate 24. Preferably, source and drain regions 12 and 14 are self-aligned as is known in the art. Following formation of gate 24, a first interlevel dielectric (ILD) layer 20 is deposited over gate 24. First ILD layer is formed of silicon dioxide, but may be formed of other dielectric materials such as silicon nitride, silicon oxynitride, as well as low-K (low dielectric constant) dielectric materials including fluorinated silicon dioxide and organic polymers.

After formation of first ILD layer 20, the layer is etched to form an opening that is filled with tungsten to form a contact plug 26, which provides ohmic contact to source region 12. Although not shown in the plane of the cross-section of FIG. 1, a similar contact plug is formed for drain region 14.

Thereafter, a first metal layer 28 is deposited on first ILD layer 20. The first metal layer 28 is formed of copper according to the device shown in FIG. 1, but may also be formed of aluminum, and in some cases, tungsten. A second ILD layer 30, an etch stop layer 32, and a third ILD layer 34 are then consecutively formed on the first metal layer 28. Layers 30, 32 and 34 are formed, patterned and etched according to conventional techniques to form openings, particularly via holes 36a and trenches 38a, via holes 36a being contiguous with respective trenches 38a. That is, each via hole shares a common, upper boundary at the interface between the via hole and the trench, where the via opens into the trench. According to the embodiment shown, a dual-inlaid process is used to deposit metal 39 simultaneously within via holes 36a and trenches 38a to form vias 36 and interconnects 38 (i.e., lines). The third ILD layer 34 includes fine pitch dielectric portions 34a separating the interconnects 38 from each other. As understood by one of ordinary skill in the art, but not shown in the drawings, the trenches 38a and the interconnects 38 extend into and out of the plane of the page, whereby the interconnects 38 make electrical contact to other interconnects or elements at the same level, or make contact through vias to interconnect lines or elements at levels above or below interconnects 38. That is, the vias 36 are confined and make electrical contact only in the vertical direction.

The metal is copper according to the embodiment shown, but may be aluminum or tungsten. In each case the metal is put down in layer form on the order of 3,000 to 11,000 angstroms in thickness. When copper is used, a conformal tantalum nitride (TaN) film (100 to 500 angstroms) is first sputtered in order to improve adhesion of the copper and to provide a barrier to prevent unwanted diffusion of the copper into the dielectric material.

Figure 2:
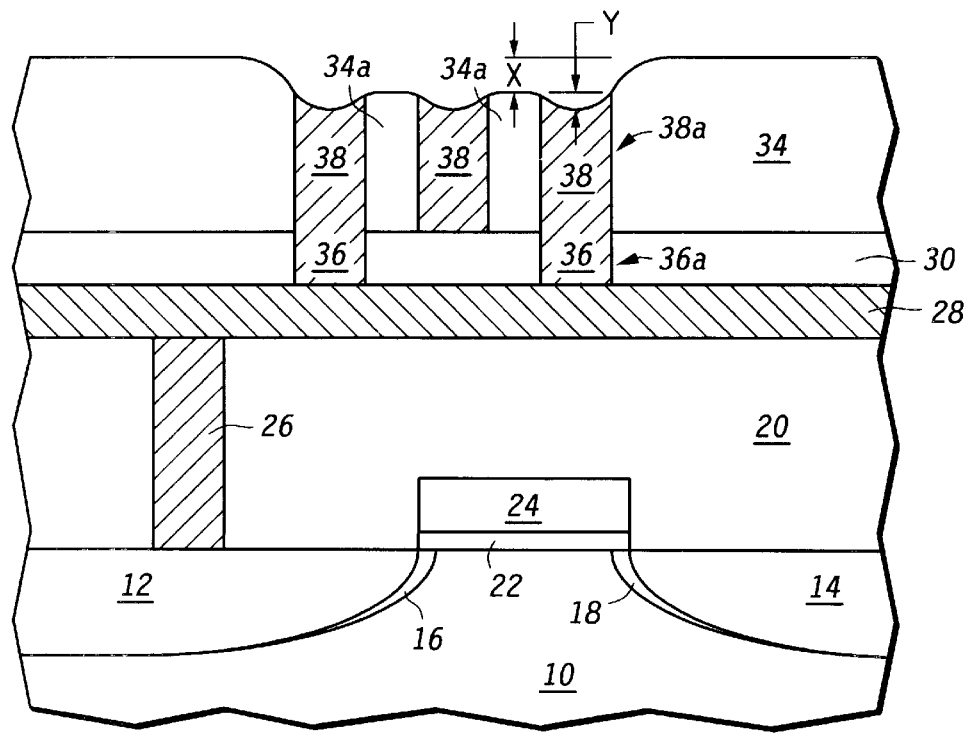
FIG. 2 is a cross-sectional view of the semiconductor device of FIG. 1 following CMP according to a process investigated by the present inventors.

Turning to FIG. 2, CMP is carried out to remove that portion of the metal 39 above trenches 38a such that the trenches 38a form separate interconnects 38, and the exposed surface of the semiconductor device is polished and planarized for subsequent deposition steps, such as higher-level metal interconnects. Following CMP, it is seen that the fine pitch dielectric portions 34a and interconnects 38 are eroded by depth X. In addition, interconnects 38 are recessed by depth Y. As recognized by the present inventors, the cumulative effect of the recessing and the erosion has a negative impact on the final device characteristics, by increasing line resistance of the finished semiconductor device. In addition, the variance in the topography features shown in FIG. 2 is projected into further layers deposited thereon. For example, after a subsequent dielectric layer is deposited so as to cover the third ILD layer 34, the surface features shown in FIG. 2 are mirrored in the thus deposited layer, and such variance in topography features may result in undesirable metal stringers, which are difficult to remove during subsequent CMP, and which may cause electrical shorts in the finished semiconductor device.

Having recognized the deficiencies with the single step CMP process used in connection with the device shown in FIG. 2, the present inventors have developed a combination-step CMP process, wherein, after depositing metal 39, first and second CMP steps are executed. In general terms, following deposition of metal 39, a first CMP step is carried out utilizing a slurry containing a chemical component (generally, a chemical oxidizer) and an abrasive component that is present at a relatively high concentration, such as approximately 2–15% by weight. An appropriate chemical oxidizer may be chosen by one of ordinary skill in the art for the particular metal composition being planarized. In connection with CMP of copper, the slurry composition described in detail in co-pending patent application Ser. No. 08/954,191 by Watts et al. (Attorney Docket No. SC90482), filed Oct. 31, 1997, may be utilized. As described therein, a chemical oxidizer component may include an oxidizing agent such as hydrogen peroxide and coordinating ligands for copper, and the abrasive component may be alumina. The subject matter of this co-pending application is herein incorporated by reference.

Figure 3:
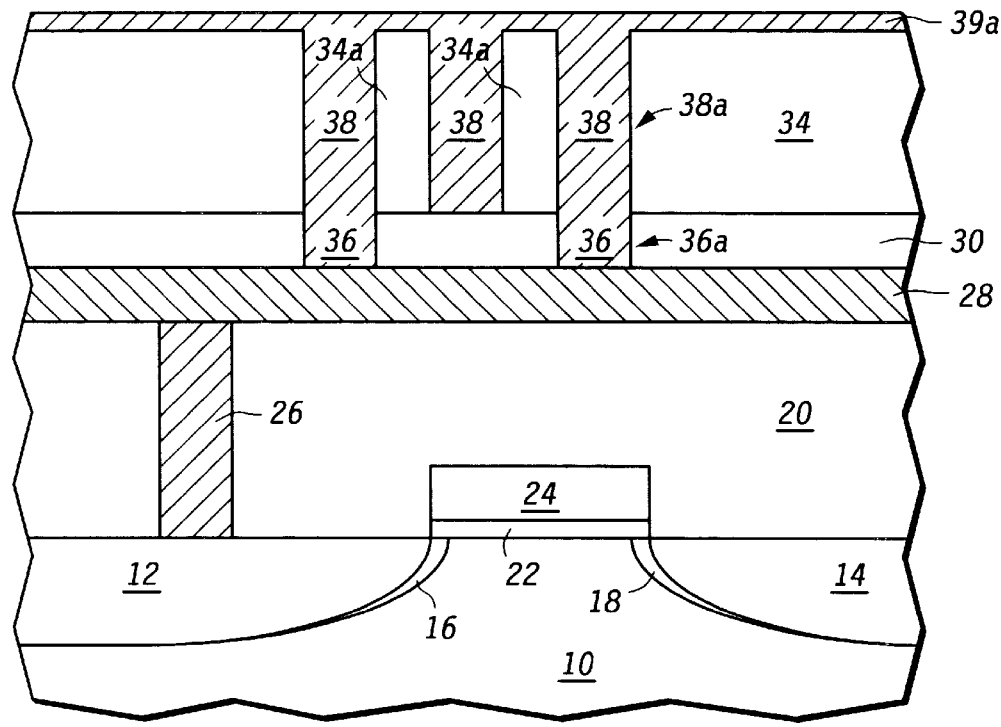
FIG. 3 is a cross-sectional view of a semiconductor device following a first CMP step according to a particular embodiment of the present invention.

According to an embodiment of the present invention, the first CMP step is carried out to planarize metal 39, but to leave a thin metal layer 39a that overlies the third ILD layer 34, as shown in FIG. 3. It is noted that the thin metal layer includes a portion of the original copper metal and the TaN barrier layer noted above, and has a thickness of approximately 200 to 3000 angstroms, preferably approximately 1000 angstroms. Prior to polishing to the depth of third ILD layer 34, which would expose the third ILD layer 3, the first step is terminated, and the polishing is continued with a second slurry having a chemical component (generally, a chemical oxidizer) and a much lower solids content of abrasive particles (which have a propensity to remove the dielectric layer), such as not greater than 1% by weight. The switch from first step to second step may be abrupt (preferred) or transient (i.e., gradual transition from one to the other). That is, a first portion of the metal is removed by the first polishing step using a first slurry containing a first proportion of abrasive material, and a second portion, overlying the dielectric layer, is removed by the second polishing step using a second slurry containing a second proportion of abrasive component, wherein the second proportion is a reduced proportion, i.e., less than the first proportion. In one embodiment, the abrasive particles of the abrasive component are eliminated, and the second slurry is non-abrasive. In this case, it is noted that the second slurry is not a true slurry because the solids content is reduced to zero. However, "slurry" is used herein to encompass this embodiment of the present invention. In addition, the chemical oxidizer of the second slurry may be the same as that of the first slurry.

Figure 4:
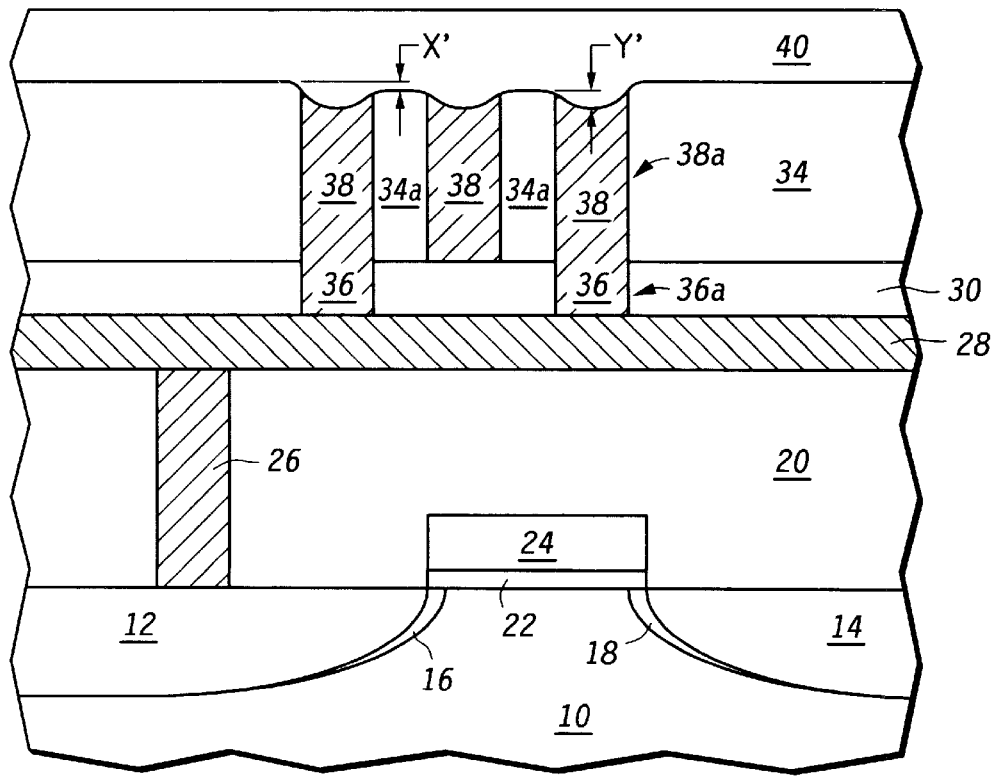
FIG. 4 is a cross-sectional view of the semiconductor device of FIG. 3 following a second CMP step.

The second step is carried out to remove completely thin metal layer 39a to define interconnects 38 separated by portions of the third ILD layer 34 and fine pitch dielectric portions 34a as shown in FIG. 4. As shown, the device may be finished with formation of passivation layer 40. Alternatively, it is noted that another dielectric layer may be deposited followed by higher level metal lines and vias. It is also emphasized that while three metal lines are shown in FIG. 4 separated by two fine pitch dielectric portions 34a, a great number of metal lines (e.g., several hundreds) are generally formed in a side-by-side relationship parallel to each other. Accordingly, it is understood that the erosion problem illustrated in connection with FIG. 2 is of particular concern.

While the combination-step CMP process has been described in general terms above, the parameters utilized in connection with a particular embodiment of the present invention are summarized below. While not shown in the drawings, the present CMP process is carried out on a wafer having a plurality of semiconductor die each having a plurality of semiconductor devices.

Process Conditions

| | |
|---|---|
| Polishing Pad | Rodel IC1400 |
| Arm Pressure | 4 psi |
| Back Pressure | 1 psi |
| Platen Speed | 59 rpm |
| Carrier Speed | 41 rpm |

Slurry compositions and CMP characteristics

| | | |
|---|---|---|
| (Step 1) | Ammonium Citrate | 0.025M (moles/L) |
| | 1,2,4-triazole | 0.1M |
| | Hydrogen Peroxide | 1% |
| | Cabot WA355 | 3% by weight alumina |
| | pH | 7.5 |
| | Avg. Cu Rate | 3800 (Å/min) |
| | Avg. Dielectric Rate | 150 |
| | Avg. TaN Rate | 250 |
| (Step 2) | Ammonium Citrate | 0.05M |
| | 1,2,4-triazole | 0.16M |
| | Hydrogen Peroxide | 1% |
| | Cabot WA355 | 0.5% by weight alumina |
| | pH | 7.5 |
| | Avg. Cu Rate | 1600 (Å/min) |
| | Avg. Dielectric Rate | 50 |
| | Avg. TaN Rate | 240 |

Process Using Step (1) only (FIG. 2):

| | |
|---|---|
| Cu Dishing (100 μm pad) | 1600 Å |
| Dielectric Erosion | |
| (0.36 μm line/0.27 μm space) | 700 Å |
| Cu line resistance (90% of 2000 devices) | <0.080 Ω/sq. |

Process Using Step (1) and Step (2) (FIG. 4):

| | |
|---|---|
| Cu Dishing (100 μm pad) | 1000 Å |
| Dielectric Erosion | |
| (0.36 μm line/0.27 μm space) | 300 Å |
| Cu line resistance (90% of 2000 devices) | <0.065 Ω/sq. |

As shown above, the erosion of the dielectric is reduced from 700 angstroms to 300 angstroms according to the process of the present invention. In addition, the line resistance is significantly reduced, from 0.080 ohms/square to 0.065 ohms/square. It is noted that the dielectric erosion noted above corresponds to the degree of erosion of fine pitch dielectric portions 34a represented by X in FIG. 2 and FIG. 5 and by X' in FIG. 4 and FIG. 6. The line pitch of the particular embodiment according to the data above is 0.63 microns (i.e., 0.36 micron line width+0.27 micron width of the dielectric portions 34a).

Figure 5:
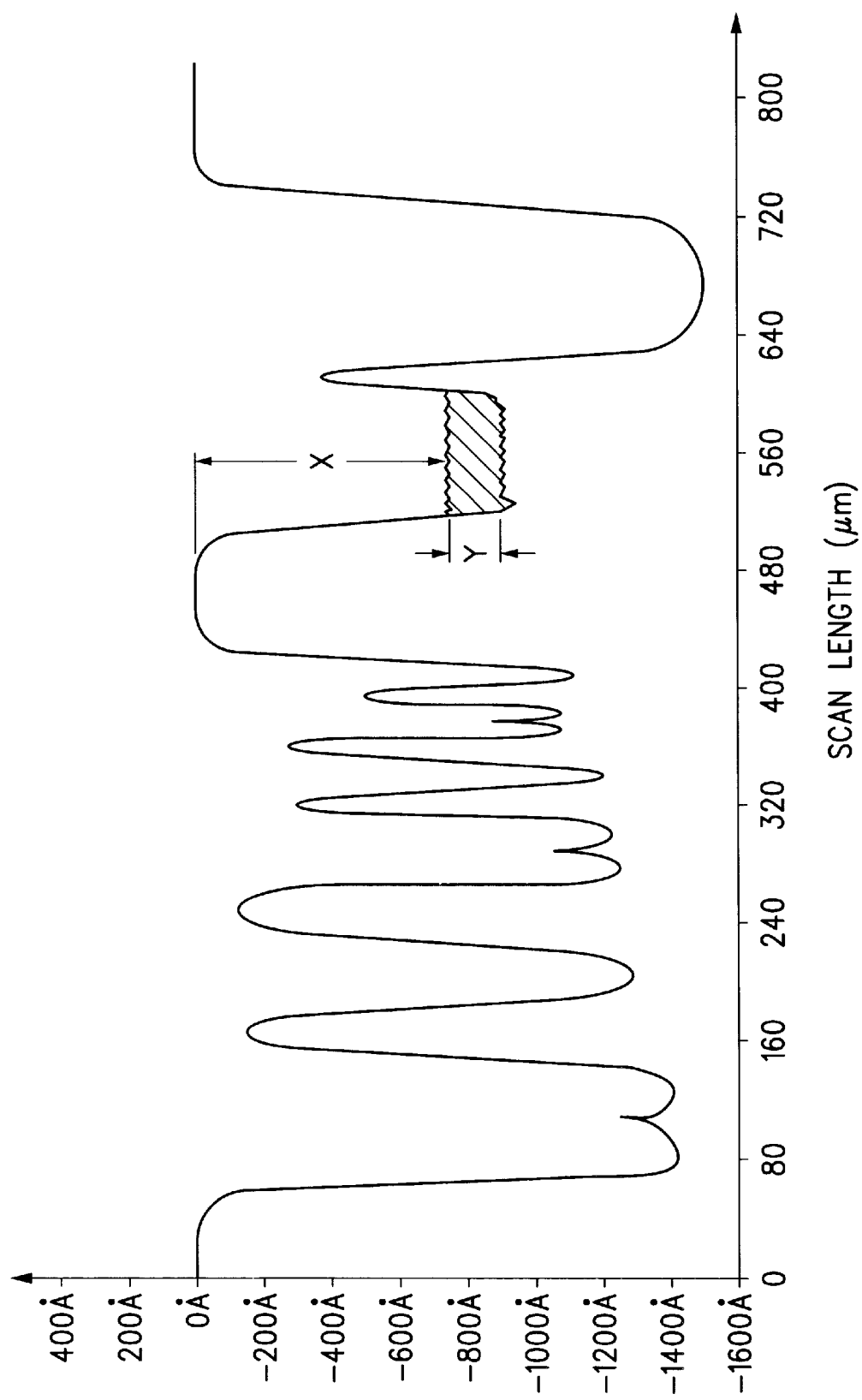
FIG. 5 is a profile across a semiconductor device test structure illustrating erosion and dishing following a single step CMP process as illustrated in FIG. 2.

FIG. 5 is a profile across the surface of a semiconductor device test structure to evaluate the topography and control of the CMP process utilizing a single step as described above in connection with FIG. 2. As shown at the 560 micron scan point on FIG. 5, the degree of erosion represented by depth X (see also FIG. 2) is fairly significant, on the order of 700 angstroms. In addition, the degree of line recessing represented by depth Y is in on the order of 150 angstroms. It is noted that the shading in FIG. 5 represents lined at such a density and small pitch that individual lines cannot be distinguished on the X-axis scale of the graph of FIG. 5. Further, as shown at scan points of approximately 100, 280 and 380 microns, the single vertical lines represent the degree of erosion of singular fine dielectric portions. As illustrated, the degree of erosion is fairly significant, on the order of 1,200 angstroms, 1,100 angstroms, and 900 angstroms, respectively.

Figure 6:
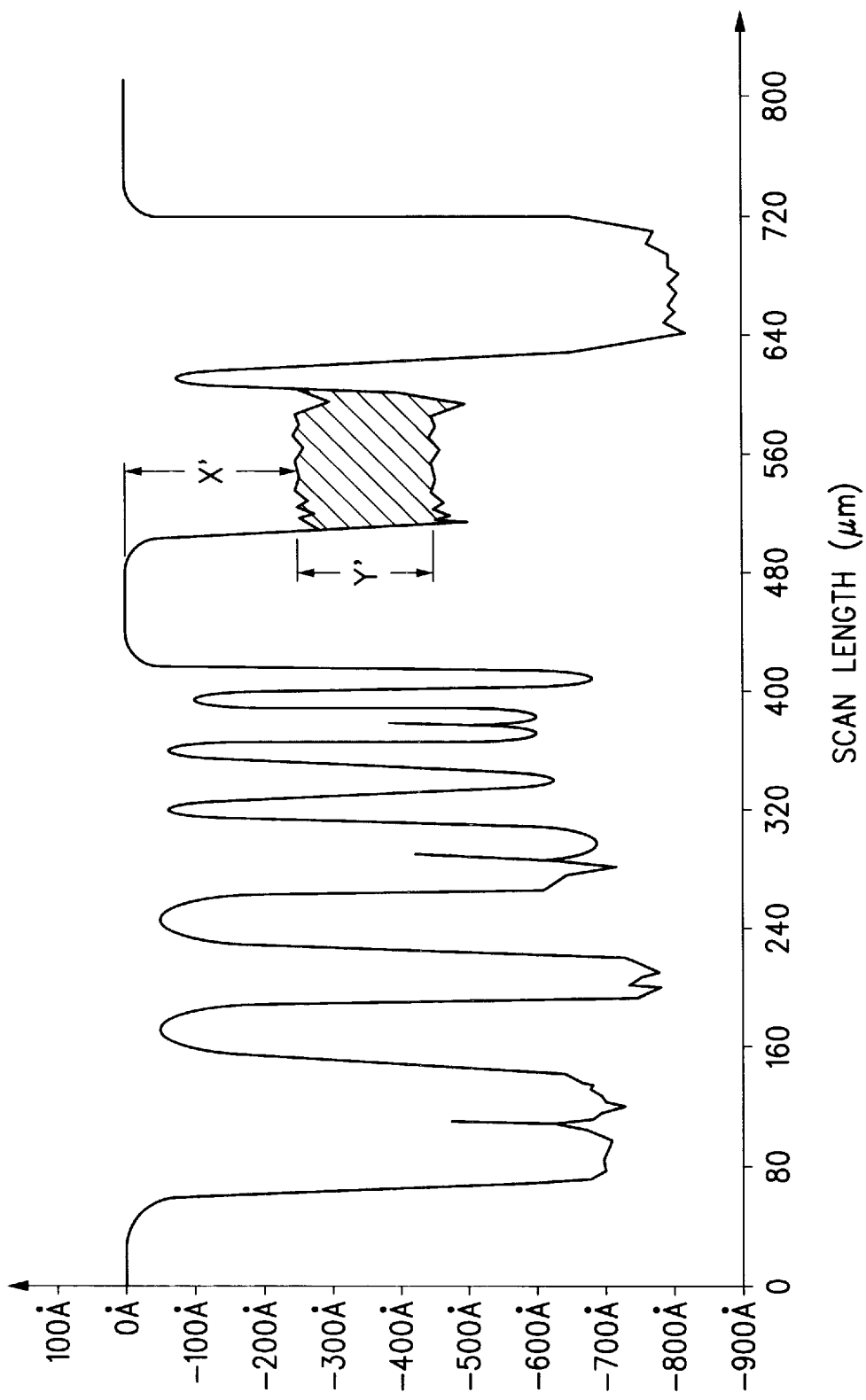
FIG. 6 is a profile across a semiconductor device test structure illustrating erosion and dishing following a combination-step CMP process according to an embodiment of the present invention as described with respect to FIGS. 3 and 4.

FIG. 6 is similar to FIG. 5, but provides profilometry data from a test structure subjected to the combination-step CMP process according to the present invention. Noteworthy, the data of FIG. 6 are plotted on a different scale along the Y-axis. It is quite clear by comparing the data provided in FIG. 6 to the data of FIG. 5, that erosion of the fine pitch dielectric portions is greatly reduced. As shown, the erosion depth X' is reduced to approximately 220 angstroms. It is noted that the recess depth Y' remains approximately the same, on the order of 150 angstroms. In addition, it is quite clear that the fine dielectric portions at scan points 100, 280 and 380 microns are not eroded to the extent shown in FIG. 5. Accordingly, it is quite clear that the combination-step CMP process according to the present invention greatly improves control of the CMP process, and attenuates erosion of fine surface features and thinning of the metal lines of the semiconductor device.

According to different embodiments, a first machine may be used for polishing using the first slurry, and a second, different machine may be used for polishing using the second slurry. Alternatively, the same machine may used for both polishing steps. If the same machine is used, it may have multiple heads for handling the semiconductor wafer, wherein a first head is used for polishing the semiconductor wafer using the first slurry and for polishing the wafer using the second slurry. Alternatively, different heads may be used for the first and second polishing steps. According to the present invention, the wafer and/or the pad may be rinsed before executing the second polishing step. However, the relatively low solids content (as low as zero) of the second slurry effectively rinses away the abrasive component of the first slurry.

While embodiments herein have been described for use with copper, it is well understood that the present invention may be utilized to CMP other metal materials, such as tungsten plugs or aluminum lines. In such cases, the chemical oxidizer and the abrasive component will change depending upon the particular metallurgy, as is well known in the art. That is, conventional CMP slurries may be utilized in connection with tungsten or aluminum.

What is claimed is:

1. A method of making a semiconductor device, comprising the steps of:

forming a dielectric layer over a substrate;

etching openings in the dielectric layer;

filling the openings and overlying the dielectric layer with a metal;

using chemical-mechanical polishing to remove a first portion of the metal overlying the dielectric layer using a first slurry containing a first proportion of an abrasive component, thereby leaving a second portion of the metal, which overlies the dielectric layer; and using chemical-mechanical polishing to remove the second portion of the metal using a second slurry containing a second proportion of abrasive component, said second proportion being less than said first proportion.

2. The method of claim 1, wherein the dielectric layer is selected from a group consisting of silicon dioxide, silicon nitride, and organic polymers.

3. The method of claim 2, wherein the dielectric layer is fluorinated silicon dioxide.

4. The method of claim 1, wherein at least one of the first slurry and the second slurry further comprises a chemical component that reacts with the metal.

5. The method of claim 4, wherein the chemical component comprises ammonium citrate, 1,2,4-triazole, and hydrogen peroxide.

6. The method of claim 1, wherein the abrasive component is alumina.

7. The method of claim 1, wherein the second proportion of abrasive component is less than 1% by weight.

8. The method of claim 1, wherein the first proportion of abrasive component is approximately 2 to 15% by weight.

9. The method of claim 1, wherein the metal is selected from aluminum, copper, and tungsten.

10. The method of claim 1, wherein etching openings in the dielectric layer comprises the steps of:

etching trenches in the dielectric layer; and etching via holes through the dielectric layer, wherein the via holes are contiguous with respective trenches.

11. A method of making a semiconductor device, comprising the steps of:

forming a dielectric layer over a substrate;

etching openings in the dielectric layer;

filling the openings and overlying the dielectric layer with a metal; and chemical-mechanical polishing the metal overlying the dielectric layer using a slurry containing a chemical component that reacts with the metal, and a material which has a propensity to remove the dielectric layer and, after removing a first portion of the metal overlying the dielectric layer and before removing all of the metal overlying the dielectric layer, reducing a content of said material.

12. The method of claim 11, wherein said material comprises an abrasive component.

13. The method of claim 11, wherein reducing the content of said material lowers the content of said material to less than 1% by weight.

14. The method of claim 13, wherein reducing the content of said material lowers the content of said material to substantially zero.

15. The method of claim 11, wherein said material comprises alumina.

16. The method of claim 11, wherein etching openings in the dielectric layer comprises the steps of:
    etching trenches in the dielectric layer; and
    etching via holes in the dielectric layer, wherein the via holes are contiguous with respective trenches.

17. A method of chemical-mechanical polishing a semiconductor wafer, comprising the steps of:
    polishing a metal layer on a semiconductor wafer using a first slurry containing a chemical component and a first proportion of an abrasive component; and
    substituting a second slurry for the first slurry after a first portion of the metal layer, less than an entirety of the metal layer, has been removed, said second slurry containing a chemical component and a second proportion of an abrasive component, said second proportion being less than said first proportion.

18. The method of claim 17, wherein the second proportion is approximately zero to 1% by weight.

19. The method of claim 17, wherein the first proportion is approximately 2 to 15% by weight.

20. The method of claim 17, wherein the abrasive component of the first slurry and the abrasive component of the second slurry comprises alumina.

21. A method of making vias and interconnects in a semiconductor device, comprising the steps of:
    forming a dielectric layer over a substrate;
    etching trenches partially through the dielectric layer;
    etching via holes in the dielectric layer, wherein the via holes are contiguous with the trenches;
    filling the via holes and trenches, and overlying the dielectric layer with a metal, whereby vias are formed in the via holes and interconnects are formed in the trenches;
    chemical-mechanical polishing to remove a first portion of the metal overlying the dielectric layer using a first slurry comprising a chemical component and an abrasive component; and
    after removing the first portion of the metal overlying the dielectric layer and before removing all of the metal over the dielectric layer, chemical-mechanical polishing using a second slurry containing chemical component and a reduced proportion of the abrasive component until the metal overlying the dielectric layer has been substantially removed, thereby leaving behind the vias and interconnects.

* * * * *